SOLID STATE FIELD EFFECT DEVICE
Filed Aug. 31, 1967 2 Sheets-Sheet 1
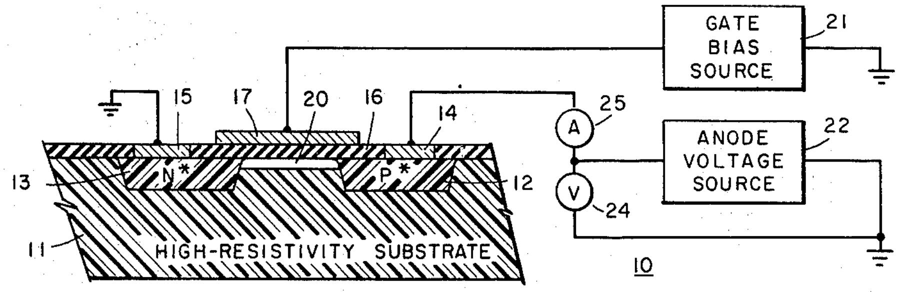
Fig. 1.
Fig. 2.
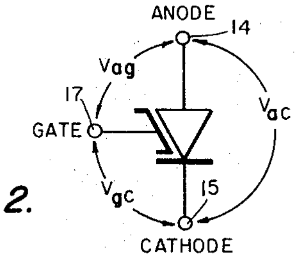
Fig. 3.
| ANODE | CATHODE | GATE | MODE | |
|---|---|---|---|---|
| − | 0 | + | LINEAR VARIABLE RESISTOR | 1. |
| − | 0 | − | CURRENT NULL | 2. |
| + | 0 | − | VARIABLE TURN-ON VOLTAGE | 3. |
| + | 0 | + | DECREASED TURN-ON VOLTAGE | 4. |
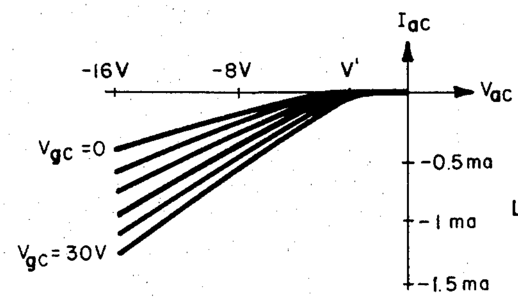
Fig. 4.
LINEAR VARIABLE RESISTOR MODE
INVENTOR.
PAUL RICHMAN
BY Joseph H. Roediger
ATTORNEY.

Dec. 1, 1970 P. RICHMAN 3,544,864
SOLID STATE FIELD EFFECT DEVICE
Filed Aug. 31, 1967 2 Sheets-Sheet 2

VARIABLE TURN-ON VOLTAGE MODE

VARIABLE TURN-ON VOLTAGE MODE

INVENTOR.
PAUL RICHMAN
BY Joseph H. Roediger
ATTORNEY.

United States Patent Office 3,544,864
Patented Dec. 1, 1970

3,544,864

SOLID STATE FIELD EFFECT DEVICE

Paul Richman, Bayside, N.Y., assignor to General Telephone & Electronics Laboratories Incorporated, a corporation of Delaware Filed Aug. 31, 1967, Ser. No. 664,836
Int. Cl. H01l 11/00
U.S. Cl. 317—235 5 Claims

ABSTRACT OF THE DISCLOSURE

An insulated-gate field effect device utilizing a high resistivity substrate in combination with low resistivity semiconductor regions of opposite conductivity type is described. The conducting channel produced by the application of a voltage to the gate electrode contains a PN junction for both positive and negative applied voltages. The location of this PN junction in the device is determined by the gate voltage and, consequently, the device exhibits several different modes of operation.

BACKGROUND OF THE INVENTION

This invention relates to solid state field effect devices of the insulated-gate type and more particularly to a device of this type exhibiting several different modes of operation.

In a solid state field effect device, the conductivity of a portion of a semiconductor wafer is modulated by an applied electric field. The insulated-gate type of field effect device is characterized by the formation of a dielectric or insulating layer on the surface of the semiconductor wafer and the placing of a control or gate electrode thereon in overlying relation. The application of a voltage to the gate electrode results in a conducting surface channel being induced in the semiconductor wafer. The conductance of this channel is modulated varying the gate voltage.

Source and drain regions of high conductivity are normally located at the opposing ends of the conducting channel. The source and drain regions are generally functionally interchangeable and are determined by the biasing conditions. In the operation of a typical MOS field effect transistor, carriers propagate between these regions not as a result of a diffusion process, but by a drift process under the action of an electric field provided by the application of a potential difference therebetween. The operating characteristics of the insulated gate MOS field effect transistor are similar to those exhibited by vacuum tube pentodes.

The MOS transistor is characterized by a high input impedance due primarly to the fact that the control or gate electrode is electrically insulated from the conducting channel. As a result of the advantages obtained from the geometry and structure of the insulated gate type devic, increasing interest has been generated in the search for other devices having different operating characteristics but possessing similar advantages. One criterion for such a device is that the fabrication thereof be relatively uncomplicated and compatible with existing MOS integrated circuit techniques. A second criterion is that the device itself be versatile in that it is capable of operation in many different modes. In addition, it is desirable to maintain the high input impedance characteristic of the insulated-gate configuration.

SUMMARY OF INVENTION

The insulated-gate field effect device provided in accordance with the present invention is capable of several different modes of operation. One feature of the present device is that the particular modes of operation are primarily determined by the polarity of the applied voltages and do not require different device structures or geometries. By virtue of these different modes of operation, the types of circuit function that may be accomplished with circuits employing insulated-gate field effect devices is expanded.

Accordingly, the present device comprises a high resistivity substrate, first and second low resistivity regions of opposite conductivity type having a separation therebetween, and means for modulating the conductivity of a surface channel in the separation between regions. In addition, the modulating means is required to overlay a substantial portion of at least one of the regions.

The first and second regions, correspond to the P-type and N-type regions respectively and are referred to herein as the anode and cathode regions respectively. Each of the regions is provided with an electrode. The modulating means includes an insulating film formed on the substrate in the separation between regions and substantially overlapping at least one of the regions. A gate electrode is provided on the film. The overlapping of the region by the modulating means results in the means modulating not only the conductivity of a surface channel of the substrate formed in the separation between regions, but also, a portion of the overlapped region.

In operation, the application of a voltage to the modulating means establishes a transverse electric field to the surface of the substrate. This field results in a movement of charge carriers within the substrate. When the modulating means is biased positively, electrons are drawn toward the surface of the semiconductor body. As a result, a highly conductive N-type channel is formed proximate to the surface of the substrate. If the substrate is high resistivity P-type or $\pi$ material, the channel is formed by the inversion of the substrate surface. However, when the applied voltage is negative and the substrate is formed of $\pi$ material, the channel is comprised of an accumulation layer. The application of a negative voltage to the modulating means produces a P-type conducting channel in the region proximate to the surface of the substrate.

Since the anode and cathode regions are of opposite conductivity type, a PN junction is formed at one end of the conducting channel. The particular end at which the junction is located depends on the conductivity type of the channel. As mentioned, the channel conductivity type is determined by the polarity of the gate voltage applied to the modulating means. Thus, changing the polarity of the applied gate voltage produces a corresponding change in the location of the PN junction. The continuous presence of a PN junction at one end of the channel in combination with the capability of changing the location of the junction has been found to provide a field effect device having several different modes of operation.

The first mode of operation of the present device occurs with the PN junction located at the anode end of the conducting channel due to the application of a positive gate voltage and with the anode maintained at a negative voltage with respect to the cathode electrode. As a result, the PN junction is reverse-biased. This mode is characterized by the fact that the relationship between anode to cathode voltage and current is essentially linear. The slope of the current-voltage characteristic is found to be a function of the magnitude of the gate voltage. Thus, the device functions as a variable resistor whose resistance is a function of the gate voltage.

The second mode of operation takes place when the PN junction is located at the cathode end of the conducting channel due to the application of a negative gate voltage and with the anode electrode maintained at a negative voltage with respect to the cathode electrode. The PN junction is reversed-biased but, unlike the first mode of operation, is located at the cathode end of the conducting channel. This mode is referred to as the current null mode.

For a constant anode to cathode voltage, the current is initially high at relatively low negative gate voltages. As the gate is made increasingly negative, the anode-cathode current decreases and then, once again increases. In addition, as the gate voltage becomes increasingly negative, the device switches from a substantially constant voltage type of operation to a substantially constant current characteristic.

The third and fourth modes of operation occur with the PN junction forward biased. For the third mode, a negative gate voltage produces a P-type conducting channel and the PN junction is located at the cathode end of the channel. The anode electrode is made positive with respect to the cathode electrode so that the junction is forward biased. As the gate voltage is made increasingly negative, starting at approximately zero, the turn-on voltage for the flow of current between the anode and cathode increases initially until a point is reached where the turn-on voltage begins to decrease for a further increase in negative gate voltage.

The fourth mode occurs when the anode to cathode voltage is positive and the gate voltage is positive so that the PN junction is located at the anode end of the conducting channel. The turn-on voltage for the anode-cathode current is found to decrease as the magnitude of the positive gate voltage increases.

Although the characteristics and the possible applications of the present device are many and varied, the structure of the device itself is not complex. In addition, the fabrication techniques utilized in making this device are compatible with the techniques employed in the fabrication of MOS integrated circuits on a single substrate. Further features and advantages of the invention will become more readily apparent from the following detailed description of a specific embodiment when taken in conjunction with the accompanying drawings.

BRIEF DESCRIPTION OF THE DRAWINGS

FIG. 1 is a side view in section of one embodiment of the invention.

FIG. 2 is an electrical symbol of the embodiment of FIG. 1.

FIG. 3 is a table showing the polarity of the different electrode voltages for the principal modes of operation of the invention.

FIGS. 4–8 are curves showing the operating characteristics for the principal modes of operation.

DESCRIPTION OF THE PREFERRED EMBODIMENT

Figures 5, 6:
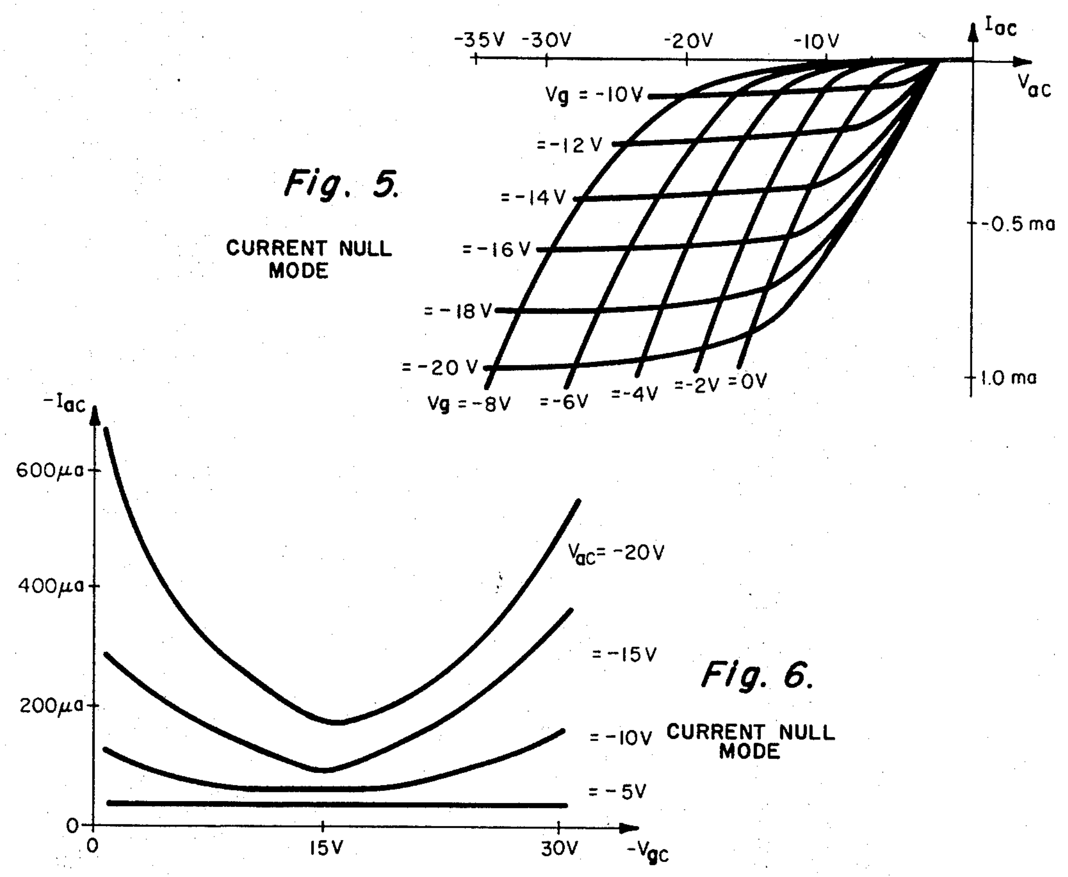

Referring now to the embodiment 10 shown in FIG. 1, a high resistivity semiconductor body or substrate 11 is provided with first and second regions 12 and 13 of opposite conductivity type formed therein. Each region 12, 13 is provided with a corresponding electrical contact 14, 15. Contact 14 is formed on region 12 having a P-type conductivity and will be referred to herein as the anode electrode. Contact 15, formed on N-type region 13, is referred to herein as the cathode electrode. Regions 12 and 13 are designated with a superscript * to indicate that the conductivity of these regions is substantially greater than that of substrate 11 but that the surface doping concentration is less than that used for the drain and source regions of conventional insulated gate MOS transistors. In conventional MOS transistors, the drain and source regions are doped to the solid solubility of the impurity in the substrate and are designated by the symbol +.

The means for modulating the conductivity of a surface conducting channel in substrate 11 comprises insulating film 16 and gate electrode 17. As shown, insulating film 16 is formed on the surface of substrate 11 and extends between the anode and cathode electrodes. Gate electrode 17 is formed on the upper surface of insulating film 16. It shall be noted that both film 16 and gate electrode 17 overlie a portion of at least one of the regions 12 and 13 in addition to overlying the separation therebetween. For reasons that will later be explained, this overlap is required to exceed 10 microns.

A conducting channel 20 is shown in FIG. 1 for purposes of illustration. TThe channel is induced at the interface of substrate 11 and film 16 by the flow of carriers within the substrate as a result of a voltage being applied to gate electrode 17. The gate voltage establishes an electric field normal to the surface of the substrate 11. This field induces a charge in the surface of the semiconductor substrate which results in a change in the density of the mobile carriers. Thus, the surface conductivity can be either enhanced or diminished by the applied field.

The device can be fabricated by conventional techniques such as those presently employed in making metal-insulator-semiconductor (MOS) devices. The substrate 11 is a semiconductor wafer, such as silicon, having a resistivity of at least 10,000 ohm-cm. The low resistivity regions 12 and 13 of opposite conductivity type are formed therein by the selective diffusion of impurities. In the case of a silicon wafer, regions 12 and 13 are generally formed by the in-diffusion of boron and phosphorus. These regions are heavily doped so that their impurity concentrations reside within the approximate range of $10^{18}$ to $10^{20}$ carriers per cubic centimeter. While the high conductivity regions are characterized by their carrier concentrations, the substrate is normally specified by its resistivity.

The substrate is required to have a resistivity of at least 10,000 ohm-cm. so that the current flow in the device is essentially confined to the conducting channel at the semiconductor-insulator interface. The use of this high resistivity substrate in combination with the first and second regions of low resistivity insures that the "off" state of the device exhibits low leakage current regardless of the conductivity type of the substrate. In the case of a high resistivity P-type substrate, generally referred to as $\pi$ material, the substrate conductivity is opposite to that of region 13 underlying cathode electrode 15 so that a PN junction is always formed at the boundary therebetween. At the boundary of region 12, the P-$\pi$ interface is found to exhibit rectifying properties very similar to those of a conventional PN junction except that when biased in the reverse direction the reverse leakage current does not saturate as it would in a PN junction diode. These characteristics, described in detail in the copending U.S. patent application S.N. 664,848, filed Aug. 31, 1967 and assigned to applicant's assignee, now U.S. Pat No. 3,493,-824, entitled "Insulated-Gate Field Effect Transistors Utilizing A High Resistivity Substrate," by P. Richman and W. Zloczower, rather than the high resistance of the conducting path through the bulk of the substrate prevent the effect of the conducting channel 20 from being appreciably degraded by conduction through a shunt path in the substrate.

The lower limit of resistivity found acceptable for both P and N type substrates in the present device is 10,000 ohm-cm. However, in practice, the preferred range has been found to have a lower limit of about 34,000 ohm-cm. Equivalent results were also obtained for substrates having resistivities in excess of 45,000 ohm-cm. The upper limit on resistivity is determined only by the intrinsic resistivity of the semiconductor material employed.

The regions 12 and 13 of opposite conductivity type are generally separated by a distance of between 0.3 and 3.0 mils in the device. This separation is the channel length shown in FIG. 1. The channel width is normally relatively large, for example about 50 mils, when compared with the channel length. The thickness of the insulating film primarily determines the gate input impedance and, for an input impedance of about $10^{13}$ ohms, the film is chosen to have a thickness within the range of 1000 to 2000 angstroms. The film 16 is readily provided by the oxidation of the substrate surface.

The characteristics of the particular insulating film employed determine whether an initial conducting channel is formed at the insulator-semiconductor interface. An initial channel arises from trapped positive charge in the insulating film and is a function of the surface potential and the number of surface traps in the substrate. In the case of a $\pi$ silicon substrate and a silicon dioxide insulating film, an initial N-type inversion layer is formed in the gap between regions 12 and 13. This layer is usually present with no applied gate voltage. When a positive voltage is applied to the gate electrode with respect to the substrate, electrons are attracted to the insulator-semiconductor interface and the initial N-type channel increases in size. However, if a negative voltage is applied to the gate, the channel tends to be depleted. As the gate voltage is made increasingly negative, holes are attracted into the channel and a P-type accumulation layer grows. This effect results in the continuous establishment of a PN junction between the conducting channel 20 and one of the regions 12 and 13.

The PN junction established within the device is located at the anode end of channel 20 when the voltage applied to the gate electrode is positive. This junction can be either forward or reverse biased depending on the polarity of the voltage applied to the anode electrode 14. As shown in FIG. 1, cathode electrode 15 is coupled to ground. When a negative voltage is applied to the gate electrode, a P-type channel is formed and the PN junction is located at the cathode end of the conducting channel. Thus, the present device contains a PN junction having a location in the conducting channel which is determined by the gate voltage.

The electrical symbol of the embodiment of FIG. 1 is shown in FIG. 2 wherein the appropriate voltages between electrodes are shown as $V_{ac}$, $V_{ag}$, and $V_{gc}$. In the testing circuit of FIG. 1, the gate and anode voltages are applied by sources 21 and 22 respectively. The anode-cathode voltage and current magnitudes for the curves in FIGS. 4–8 are indicated by voltmeter 24 and ammeter 25. The different modes of operation provided by the invention are set forth in tabular form in FIG. 3.

The first characteristic mode is referred to as the linear variable resistor mode and the representative $I_{ac}$–$V_{ac}$ curves therefore are shown in FIG. 4. This mode arises when a positive gate voltage $V_{gc}$ establishes the PN junction at the anode end of the conducting channel and the anode to cathode voltage $V_{ac}$ is negative so that the junction is reverse biased. In this mode, the device acts as a linear variable resistor in series with an offset voltage. The offset voltage $V^1$ was found to be about 0–6 volts. The linearity of the characteristics over a wide dynamic range shown by this first mode indicates that the device is suitable for use in electrically variable voltage dividers, gain controlled amplifiers, and feedback control circuits.

The second mode of operation is obtained when the PN junction is shifted to the cathode end of the conducting channel by applying a negative voltage to the gate electrode. The PN junction is reverse biased, as in the case of the first mode, by the application of a negative voltage to the anode electrode. The $I_{ac}$–$V_{ac}$ characteristics of the device when operated in this mode are shown in FIG. 5. In addition, FIG. 6 contains a series of curves showing the relationship between $I_{ac}$ and $V_{gc}$ for this mode of operation. Referring now to FIG. 6, it was found that as the gate voltage $V_{gc}$ is varied for constant anode voltages $V_{ac}$, the current $I_{ac}$ starts off relatively high, then decreases to a null value whereupon it begins to increase. The $I_{ac}$–$V_{ac}$ curves of FIG. 5 exhibit a mesh-like overlapping which indicates that in the second mode of operation the device switches from a constant voltage characteristic at low negative gate voltages to a constant current characteristic at large negative gate voltages. The characteristics of this mode indicate that the present device, when so operated, can be employed in frequency multiplying circuits, time delay circuits and amplifying circuits.

While both the first and second modes of operation utilize a reverse biased PN junction, the difference in the location of the PN junction in the device is found to provide different operating characteristics. Thus, the present device, unlike the conventional insulated gate field effect device, is not symmetrical. In other words, the anode and cathode are not interchangeable. The lack of symmetry of the electrical characteristics is caused by the different electric field distributions at the surface of the junctions of the different modes.

The overlapping of region 13 by the gate electrode 17, as shown in FIG. 1, enables the electric field in the insulating film directly above region 13 to create an inversion layer within that portion of the region that is overlapped by the gate electrode when the gate voltage is negative. However, for regions having relatively high impurity concentrations, for example about $10^{20}$ carriers per cm.$^3$ or greater, this inversion layer cannot be obtained at gate voltage levels which are less than the breakdown field strength of the insulating film. When the junction formed by the P inversion layer and region 13 is reverse biased, tunnel emission can break down the junction formed between the inversion layer and the rest of the region if the impurity concentration of the region 13 is usfficiently high to render the region 13 degenerate by causing an overlap between the conduction and valence bands in the energy level structure of this junction. In the preferred embodiment utilizing a silicon substrate, the impurity concentration is required to be within the range of $10^{18}$ to $10^{20}$ carriers per cm.$^3$.

The minimum impurity concentration is that required to obtain an overlap between the conduction and valence bands in the energy level structure of this junction with zero applied voltage. This band overlap is necessary for tunnel emission. The tunnel emission provides the operating characteristics of FIGS. 5 and 6.

While only the region that is provided with an electrode that is coupled to ground need be overlapped by the gate electrode to obtain all four modes of operation, the overlapping of both regions during fabrication permits the device to be operated with either the anode or cathode electrode grounded.

The amount of overlapping of a region by the gate electrode is required to be greater than 10 microns to insure that the inversion layer necessary for tunnel emission is established in the region. The preferred range of overlapping is from 12.5 to 20 microns. As the area of the overlap increases, the interelectrode capacitance also increases thereby reducing the high frequency cut-off point of the device. Consequently, the upper limit on the amount of overlap is determined primarily by the particular application of the device.

Figure 7:
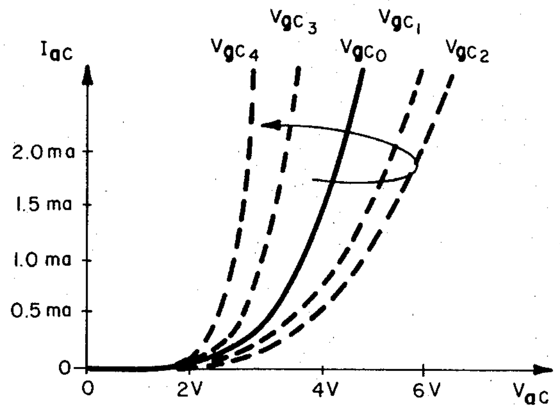
Figure 8:
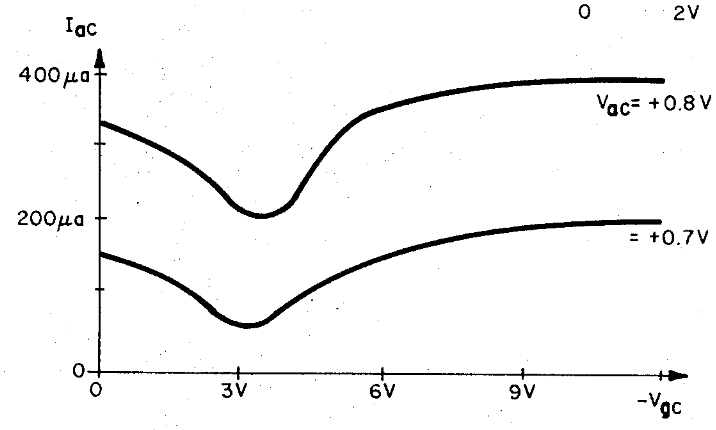

Operating modes 3 and 4 take place when the voltage $V_{ac}$ is positive so that the PN junction is forward biased. In mode 3 operation the PN junction is located at the anode end of the conducting channel with zero gate voltage. The turn-on voltage required for appreciable conduction through the device is found to increase initially as the gate voltage $V_{gc}$ is made more negative, starting at zero. As the voltage $V_{gc}$ is made increasingly more negative, the device turn-on voltage begins to decrease to less than the initial value. The curves of FIG. 7 show the variation in the $I_{ac}$–$V_{ac}$ characteristics for increasingly more negative voltages $V_{gc0}$ through $V_{gc4}$. The locus of these curves is indicated by the arrow thereabove. The range of $V_g$, shown is from 0 to $-15$ v. Also, FIG. 8 illustrates the variation in current $I_{ac}$ with the gate voltage $V_{gc}$ for a constant anode voltage $V_{ac}$. It is seen from FIG. 8 that the current $I_{ac}$ initially decreases and then increases. The open geometry field effect structure generally employed has been found to provide approximately 20 percent variation in turn-on voltage. The operating characteristics of mode 3 are believed to result from the depletion of the N channel that exists at zero gate voltage by the application of a small negative gate voltage. For high negative gate voltage, a P channel is formed.

Mode 4 operation occurs with forward anode-cathode bias and positive gate voltage. This mode is characterized by a variation in turn-on voltage of about 15 percent as the gate voltage $V_{gc}$ is made increasingly positive. However unlike mode 3, the turn-on voltage does not undergo an initial increase but continually decreases from the zero gate voltage curve. The curves of FIG. 7, omitting $V_{gc1}$ and $V_{gc2}$, are typical of this mode of operation.

From the foregoing description of the device and the different characteristics of the four modes of operation, it will be recognized that the present device is capable of performing many varied electrical circuit operations. The device can be made in any geometry, for example elongated or circular, presently used for insulated-gate field effect devices. The fabrication techniques for the present device are not complex and are compatible with the techniques utilized in forming integrated planar electrical components on a substrate. For example, the embodiment of FIG. 1 can be formed by the diffusion of regions 12 and 13 in a silicon substrate. The insulated gate structure and the electrodes 14 and 15 may be formed by oxidation or evaporation. The device may also be made in thin film form on an insulating substrate, such as utilized in silicon layer on sapphire substrate devices.

While the above description has referred to a specific embodiment of the invention, it is apparent that many variations and modifications may be made therein without departing from the spirit and scope of the invention.

What is claimed is:

1. A field effect device comprising:

(a) a high resistivity semiconductive substrate of a single conductivity type, said substrate having a resistivity of at least 10,000 ohm-cm.;

(b) first and second regions of low resistivity formed in said substrate and having a separation therebetween, said regions having opposite conductivity types; and (c) means for modulating the surface conductivity of said substrate in the separation between regions, said means being formed on said substrate and overlapping at least one of said regions by a distance of at least 10 microns whereby the application of a first polarity voltage to said means establishes an inversion layer in said one region.

2. The field effect transistor of claim 1 in which said means for modulating the surface conductivity of said substrate comprises:

(a) an insulating film formed on said substrate and overlaps said one region by a distance of at least 10 microns, and (b) a gate electrode formed on said insulating layer.

3. The field effect device of claim 2 in which said regions have an impurity concentration within the range of $10^{18}$ to $10^{20}$ carriers per cubic centimeter.

4. The field effect device of claim 3 in which said means for modulating the surface conductivity of said substrate overlaps both of said regions by a distance within the range of 10 to 25 microns.

5. The field effect device of claim 4 in which said substrate has a resistivity of at least 34,000 ohm-cm.

References Cited

UNITED STATES PATENTS

| | | | |
|---|---|---|---|
| 2,791,761 | 5/1957 | Morton | 317—235 |
| 3,264,493 | 8/1966 | Price | 307—88.5 |
| 3,283,170 | 11/1966 | Buie | 317—235 |
| 3,287,611 | 11/1966 | Bockemuehl et al. | 317—235 |
| 3,305,708 | 2/1967 | Ditrick | 317—234 |
| 3,378,688 | 4/1968 | Kabell | 250—211 |
| 3,045,129 | 7/1962 | Atalla et al. | 307—88.5 |
| 3,246,177 | 4/1966 | Schroeder | 307—88.5 |
| 3,296,462 | 1/1967 | Reddi | 307—88.5 |
| 3,321,680 | 5/1967 | Arndt et al. | 307—234 |
| 3,333,115 | 7/1967 | Kawakami | 307—88.5 |
| 3,334,281 | 8/1967 | Ditrick | 317—235 |
| 3,341,380 | 9/1967 | Mets et al. | 148—187 |
| 3,386,016 | 5/1968 | Lindmayer | 317—235 |

JERRY D. CRAIG, Primary Examiner

U.S. Cl. X.R.

307—304